US008114697B2

(12) United States Patent
Kim et al.

(10) Patent No.: US 8,114,697 B2
(45) Date of Patent: Feb. 14, 2012

(54) PIEZOELECTRIC MICROPHONE, SPEAKER, MICROPHONE-SPEAKER INTEGRATED DEVICE AND MANUFACTURING METHOD THEREOF

(75) Inventors: Hye Jin Kim, Daejeon (KR); Sung Q Lee, Daejeon (KR); Sang Kyun Lee, Gwangju (KR); Jae Woo Lee, Daejeon (KR); Kang Ho Park, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 789 days.

(21) Appl. No.: 12/195,311

(22) Filed: Aug. 20, 2008

(65) Prior Publication Data

US 2009/0154735 A1 Jun. 18, 2009

(30) Foreign Application Priority Data

Dec. 18, 2007 (KR) ........................ 10-2007-0133464

(51) Int. Cl.
*H01L 21/00* (2006.01)
*H04R 25/00* (2006.01)

(52) U.S. Cl. .................. 438/51; 257/E21.499; 381/173; 381/190

(58) Field of Classification Search .................. 381/190, 381/173; 438/51; 257/E21.499
See application file for complete search history.

(56) References Cited

U.S. PATENT DOCUMENTS 6,091,182 A * 7/2000 Takeuchi et al. .............. 310/330
2004/0256961 A1* 12/2004 Namba et al. ................. 310/365
2005/0099100 A1* 5/2005 Kita et al. ..................... 310/367

FOREIGN PATENT DOCUMENTS

| | | | |
|---|---|---|---|
| JP | 11-186867 | A | 7/1999 |
| KR | 1019970052583 | | 7/1997 |
| KR | 1020030062899 | A | 7/2003 |
| KR | 1020030075906 | A | 9/2003 |
| KR | 1020040003096 | A | 1/2004 |
| KR | 1020050107071 | A | 11/2004 |
| KR | 1020060127013 | A | 12/2006 |
| KR | 1020070042756 | A | 4/2007 |
| KR | 1020080052230 | | 6/2008 |

OTHER PUBLICATIONS

Jian Cai et al., "A study on Packaging of PZT MEMS Microphone", 2005 Electronics Components and Technology Conference, 2005 IEEE, pp. 1077-1080.

* cited by examiner

*Primary Examiner* — Lex Malsawma

(57) ABSTRACT

A piezoelectric microphone, a speaker, a microphone-speaker integrated device and a manufacturing method thereof are provided. The microphone-speaker integrated device includes a silicon substrate and an insulating layer deposited on the silicon substrate; a piezoelectric plate formed on the insulating layer; and a mating electrode formed on the piezoelectric plate. The mating electrode is patterned with a polarity arrayed in series.

18 Claims, 9 Drawing Sheets

PIEZOELECTRIC MICROPHONE, SPEAKER, MICROPHONE-SPEAKER INTEGRATED DEVICE AND MANUFACTURING METHOD THEREOF

CROSS-REFERENCE TO RELATED APPLICATION

This application claims priority to and the benefit of Korean Patent Application No. 2007-133464, filed Dec. 18, 2007, the disclosure of which is incorporated herein by reference in its entirety.

BACKGROUND

1. Field of the Invention

The present invention relates to a piezoelectric microphone, a speaker, a microphone-speaker integrated device, and a manufacturing method thereof, and more particularly, to a microphone with a pattern structure for enhancing efficiency of a piezoelectric microphone having a mating structure, a speaker having a differentially etched piezoelectric plate and a series/parallel mating electrode, a microphone-speaker integrated device, and a manufacturing method thereof.

This work was supported by the IT R&D program of MIC/IITA. [2006-S-006-02, Component Module for Ubiquitous Terminal]

2. Discussion of Related Art

Technology for miniaturizing a microphone and a micro-speaker on a silicon wafer has been disclosed. The disclosed method of manufacturing an acoustic transducer on a silicon wafer reduces costs since the manufacture can be performed by batch processing, and miniaturizes the device because a plurality of transducers and amplifiers can be integrated on a single chip, thereby having many advantages over other conventional methods.

However, the piezoelectric-type acoustic transducer has the problems that the microphone has a relatively low sensitivity due to tensile residual strain in a transducer vibration plate, and the micro-speaker has a low output. To solve these problems, there has been proposed a voice converting apparatus using a mating electrode instead of a piezoelectric voice converting apparatus using conventional upper and lower electrodes.

SUMMARY OF THE INVENTION

The present invention is directed to a piezoelectric microphone, a speaker, a microphone-speaker integrated device, and a manufacturing method thereof.

The present invention is also directed to a piezoelectric microphone, a speaker, a microphone-speaker integrated device, and a manufacturing method thereof, in which the microphone has a mating electrode pattern arrayed in series, and the speaker has a differentially etched piezoelectric plate and a series/parallel mating electrode pattern.

According to an aspect of the present invention, there is provided a piezoelectric microphone including: a silicon substrate and an insulating layer deposited on the silicon substrate; a piezoelectric plate formed on the insulating layer; and a mating electrode formed on the piezoelectric plate. The mating electrode is patterned with a polarity arrayed in series.

The silicon substrate may be etched from a rear surface to the insulating layer. Further, the insulating layer may include one of silicon, a silicon oxide series compound and a silicon nitride series compound. The piezoelectric plate may be either adhered using an epoxy series adhesive or deposited using a sol-gel method. The piezoelectric plate may include a single layer of PZT, PMN-PT, PVDF, ZnO, AlN or a lead-free piezoelectric material. Alternatively, the piezoelectric plate may include a multi-layer of Ti, Pt, PZT and Pt. Also, the mating electrode may be patterned on at least one of an outer circumference and a center of the piezoelectric plate.

According to another aspect of the present invention, there is provided a piezoelectric speaker including: a silicon substrate and an insulating layer deposited on the silicon substrate; a piezoelectric plate formed on the insulating layer; and a mating electrode formed on the piezoelectric plate. The piezoelectric plate is differentially etched with respect to a portion where the mating electrode is formed and an outer circumferential portion, so that the outer circumferential portion is thinner than the portion where the mating electrode is formed.

The silicon substrate may be etched from a rear surface to the insulating layer. Further, the insulating layer may include one of silicon, a silicon oxide series compound and a silicon nitride series compound. Also, the piezoelectric plate may be either adhered using an epoxy series adhesive or deposited using a sol-gel method. The piezoelectric plate may include a single layer of PZT, PMN-PT, PVDF, ZnO, AlN or a lead-free piezoelectric material. Alternatively, the piezoelectric plate may include a multi-layer of Ti, Pt, PZT and Pt. The piezoelectric plate may be etched using either of mechanical grinding or dry etching using inductively coupled plasma. The insulating layer may be etched according to patterns and the etched pattern may be filled with one of a rubber film and a highly elastic resin film.

According to still another aspect of the present invention, there is provided a piezoelectric speaker-microphone integrated device in which the piezoelectric microphone and the piezoelectric speaker are formed on the same silicon substrate.

According to yet another aspect of the present invention, there is provided a method of manufacturing a piezoelectric microphone, including: depositing an insulating layer on a silicon substrate; forming a piezoelectric plate on the insulating layer; and patterning a mating electrode on the piezoelectric plate. The mating electrode is formed with a polarity arrayed in series.

According to still yet another aspect of the present invention, there is provided a method of manufacturing a piezoelectric speaker, including: depositing an insulating layer on a silicon substrate; forming a piezoelectric plate on the insulating layer; differentially etching the piezoelectric plate so that an outer circumference of the piezoelectric plate is thinner than a center thereof; and patterning a mating electrode on the piezoelectric plate.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, a piezoelectric microphone, a speaker, a microphone-speaker integrated device and a manufacturing method thereof according to exemplary embodiments of the present invention will be described in detail with reference to the accompanying drawings.

Figure 1:
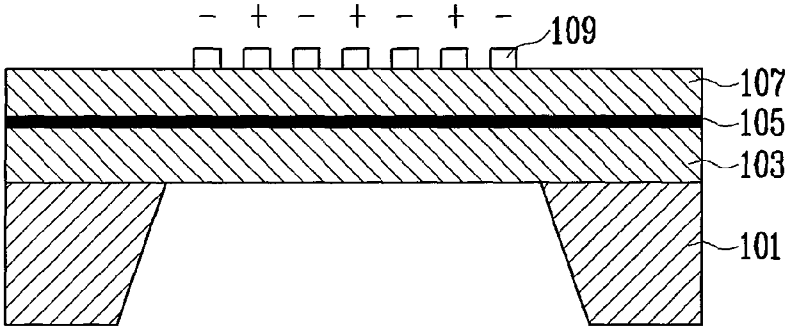
FIG. 1 (PRIOR ART)
FIG. 1 is a side view of a conventional piezoelectric microphone to be compared with an embodiment of the present invention.

FIG. 1 is a side view of a conventional piezoelectric microphone to be compared with an embodiment of the present invention;

Referring to FIG. 1, the conventional piezoelectric microphone includes a silicon substrate layer 101, an insulating layer 103, an adhesive layer 105, a piezoelectric layer 107, and a mating electrode layer 109.

The silicon substrate layer 101 is a silicon substrate used as a base when manufacturing the microphone through a micro electro mechanical system (MEMS) process. In the last process, the silicon substrate layer 101 is etched for vibration of a piezoelectric element.

The insulating layer 103 is a thin film that generally includes a silicon compound. When the silicon substrate layer 101 is etched, the insulating layer 103 serves as the thin film for masking it.

The adhesive layer 105 is a layer including an adhesive for adhering the insulating layer 103 and the piezoelectric layer 107 in the piezoelectric microphone.

The piezoelectric layer 107 is one of the most important parts in the piezoelectric microphone, and includes the piezoelectric element for converting a physical vibration signal based on sound into an electrical signal.

The mating electrode layer 109 receives the electrical signal converted by the piezoelectric layer 107. Also, the mating electrode layer 109 is one of the most important parts in the piezoelectric microphone along with the piezoelectric layer 107.

The mating electrode layer 109 is patterned on the piezoelectric layer 107. The efficiency of the microphone varies according to the patterns of the mating electrode layer 109.

The conventional mating electrode layer 109 has a parallel pattern. Such a parallel pattern has a disadvantage in that a voltage level generated under the same pressure is lower than that of a series pattern.

Figure 2:
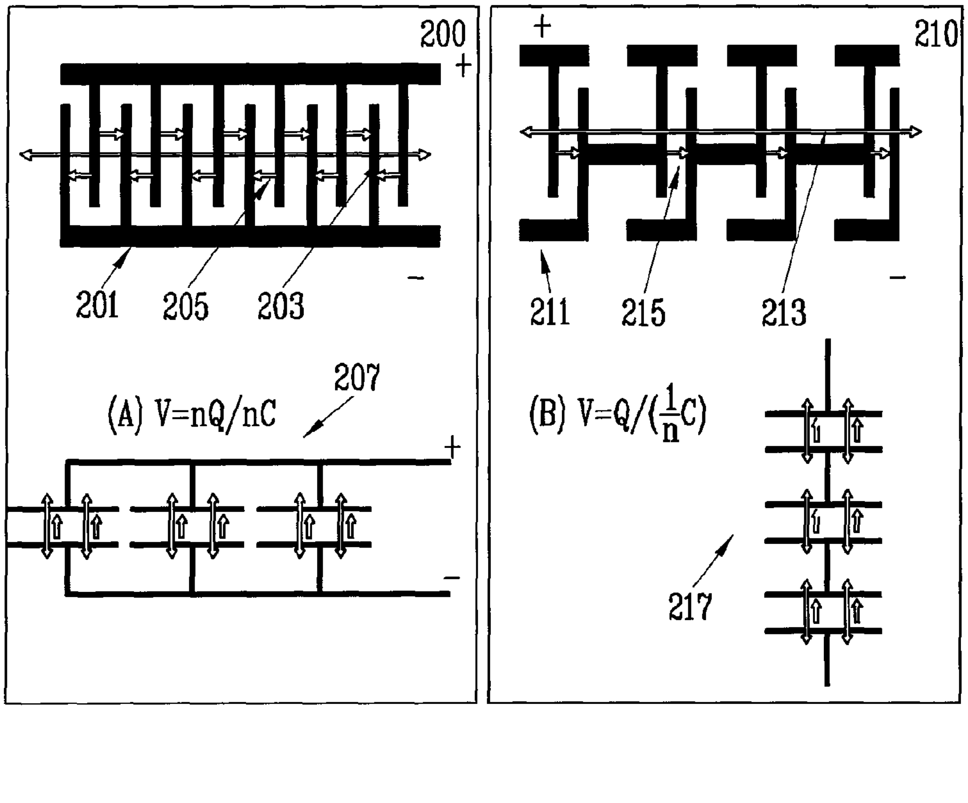
FIG. 2 is a view for explaining voltage generated according to patterns of a mating electrode layer.

FIG. 2 is a view for explaining voltage generated according to patterns of a mating electrode layer.

In FIG. 2, reference numeral '200' indicates the conventional mating electrode having the parallel pattern, and reference numeral '210' indicates a mating electrode having a series pattern according to an embodiment of the present invention.

In a parallel mating pattern 201, a positive electrode and a negative electrode are arrayed in parallel, where a long arrow 203 indicates a strain direction and a short arrow 205 indicates a poling direction.

Further, reference numeral '207' indicates a circuit structure corresponding to the parallel mating pattern 201. The circuit structure 207 is shown as if capacitors are connected in parallel. With this structure, the voltage level can be calculated by equation (A): $V=nQ/nC$, where n is the number of capacitors, Q is the quantity of electric charge in the capacitor, and C is capacitance.

On the other hand, in a series mating pattern 211, the positive and negative electrodes are arrayed in series, where a long arrow 213 indicates the strain direction and a short arrow 215 indicates the poling direction.

Also, reference numeral '217' indicates a circuit structure corresponding to the series mating pattern 211. The circuit structure 217 is shown as if capacitors are connected in series. With this structure, the voltage level can be calculated by equation (B): $V=Q/(C/n)$, where n is the number of capacitors, Q is the quantity of electric charge in a capacitor, and C is capacitance.

As the number of capacitors increases, the voltage level from equation (B) becomes higher but that from equation (A) hardly varies.

Thus, when the same pressure is applied, the series mating pattern can transfer a higher voltage than the parallel mating pattern.

Figure 3:
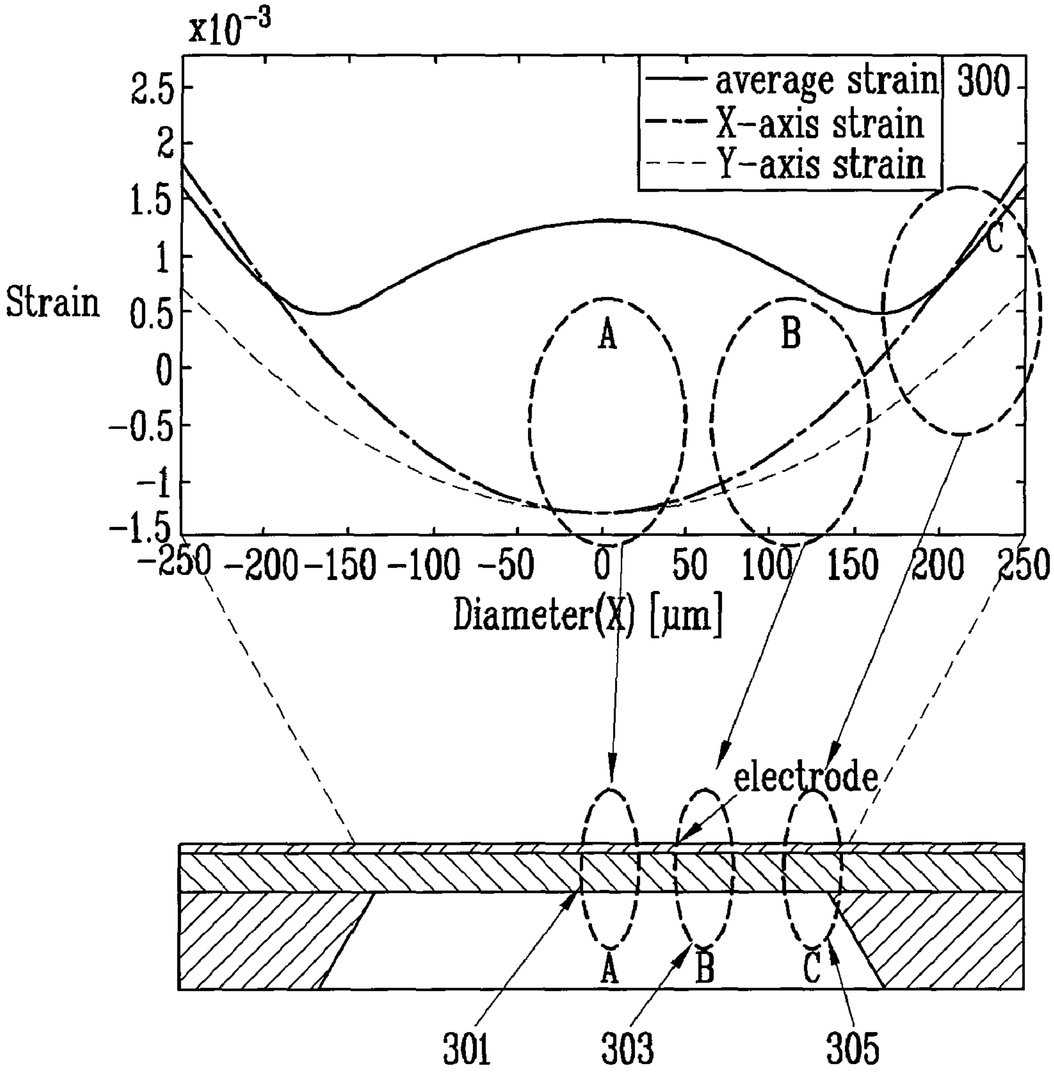
FIG. 3 is a view for determining a position where a series pattern will be formed according to an embodiment of the present invention.

FIG. 3 is a view for determining a position where a series pattern will be formed according to an embodiment of the present invention.

Referring to FIG. 3, the graph showing reference numeral '300' illustrates strain according to position and distance from the center of the microphone according to an embodiment of the present invention.

In the graph, reference letters A (301), B (303) and C (305) indicate positions in the piezoelectric microphone (see reference numeral '310').

Referring to the graph, the most strain is applied to positions C (305) and A (301) in the piezoelectric microphone. In other words, the piezoelectric microphone is scarcely strained except at the center and edges thereof.

Accordingly, there is no problem in converting the physical vibration signal owing to the strain into the electrical signal even though the mating electrode is formed at only an outer circumference of the microphone.

Figure 4:
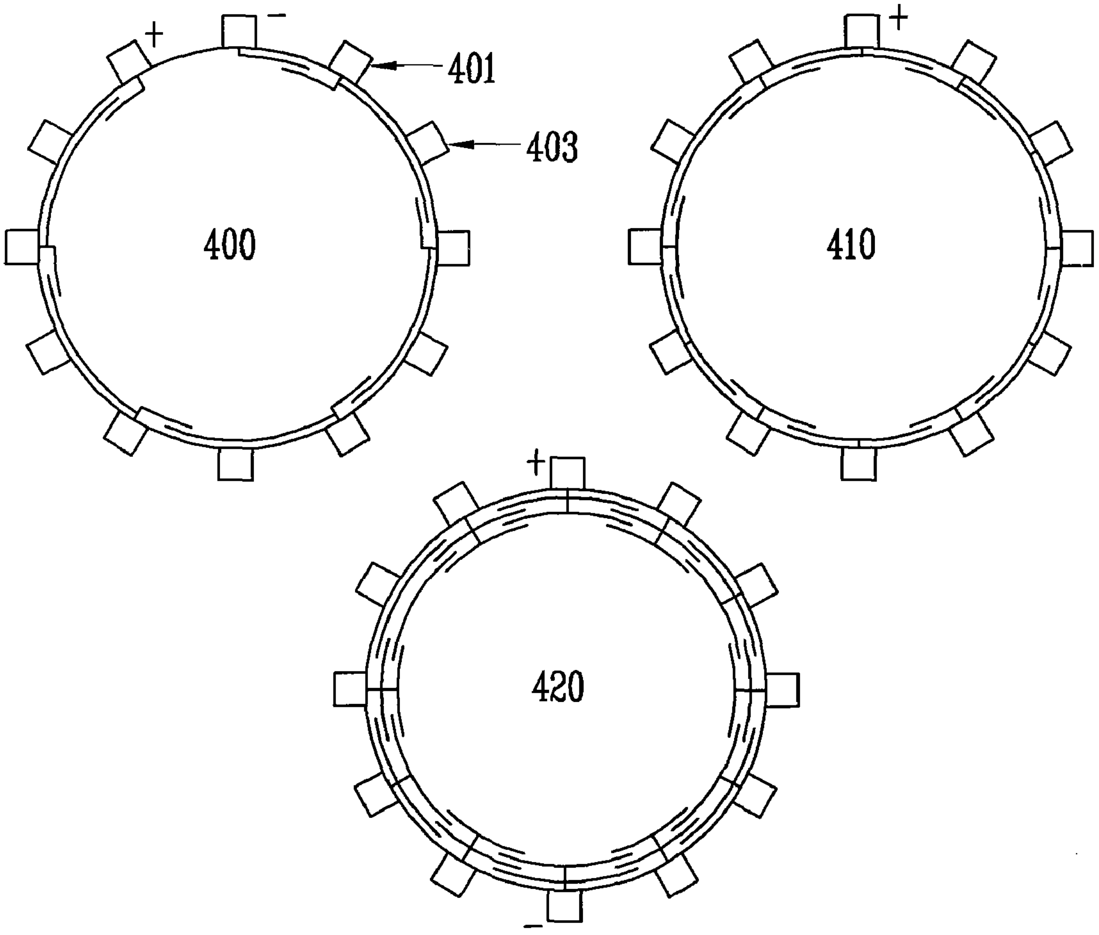
FIG. 4 shows a mating electrode pattern of a piezoelectric microphone according to an embodiment of the present invention.

FIG. 4 shows a mating electrode pattern of a piezoelectric microphone according to an embodiment of the present invention.

As shown in FIG. 4, reference numeral '400' indicates that the series mating pattern explained with reference to FIG. 2 is applied to the outer circumference explained with reference to FIG. 3.

Referring to outer rectangular electrodes from reference numeral '400,' a positive electrode 401 and a negative electrode 403 are formed alternately, and patterns branching from the respective electrodes are arrayed in series. In other words, it is shown as if the series mating pattern of FIG. 2 is rounded along the outer circumference of the microphone.

Reference numeral '410' indicates a pattern according to another embodiment of the present invention. In the pattern shown by reference numeral '410,' the poling directions of the series mating pattern are not the same but alternately reversed. This case may have more capacitors than that of reference numeral '400.'

Reference numeral '420' indicates a pattern according to a third embodiment of the present invention. Reference numeral '420' shows the existing parallel pattern formed in the next outer circumference in addition to the same pattern as reference numeral '410.' In other words, the patterns branching from the respective electrodes form a parallel secondary pattern.

Besides the foregoing embodiments, many different patterns are possible. However, according to an embodiment of the present invention, the series mating pattern is formed at only the outer circumference of the microphone. Although the series mating pattern according to an embodiment of the present invention is less than the existing parallel mating pattern, the voltage can be further efficiently output.

Figure 5A:
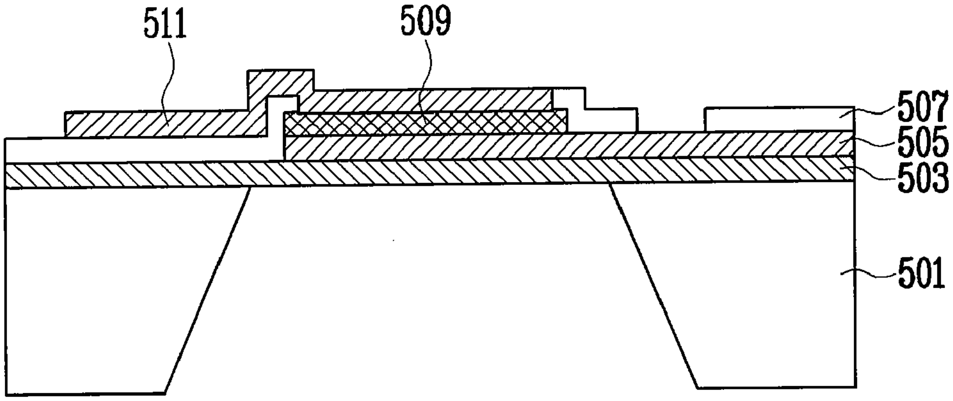
FIG. 5A (PRIOR ART)
FIGS. 5A and 5B are cross-sectional views of a conventional micro-speaker to be compared with an embodiment of the present invention.
Figure 5B:
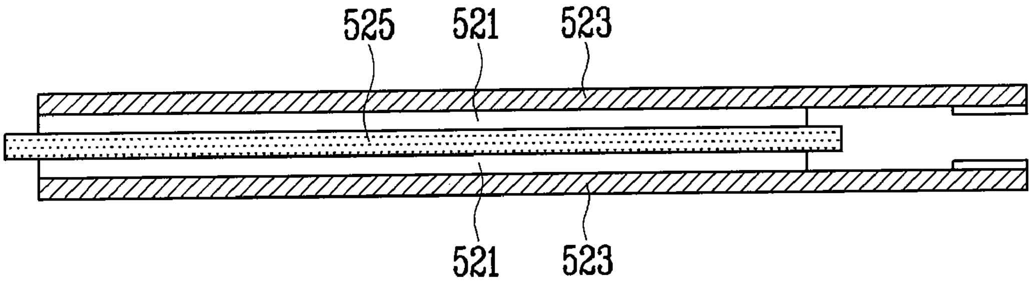
FIG. 5B (PRIOR ART)

FIGS. 5A and 5B are cross-sectional views of a conventional micro-speaker to be compared with an embodiment of the present invention.

FIG. 5A is a cross-sectional view of a conventional piezoelectric micro-speaker. Referring to FIG. 5A, the conventional piezoelectric micro-speaker includes a silicon substrate layer 501, a insulating layer 503, a lower electrode 505, a piezoelectric material 509, an upper electrode 511 and a shielding layer 507. Such a conventional piezoelectric micro-speaker employs the property of piezoelectric material by which it converts an electrical signal generated in the upper and lower electrodes into a physical vibration signal to thereby generate an acoustic signal.

FIG. 5B is a cross-sectional view of a conventional piezoelectric micro-speaker using a piezoelectric film. In such a piezoelectric micro-speaker, a polymer conductive layer or electrode 521 is formed on opposite sides of a piezoelectric film 525, and an electrode layer 523 is connected to the edge of the conductive layer or electrode 521 through a terminal.

In general, the piezoelectric speaker using the piezoelectric film is so difficult to be used as a micro-speaker that it is used for a large-sized speaker.

Figure 6:
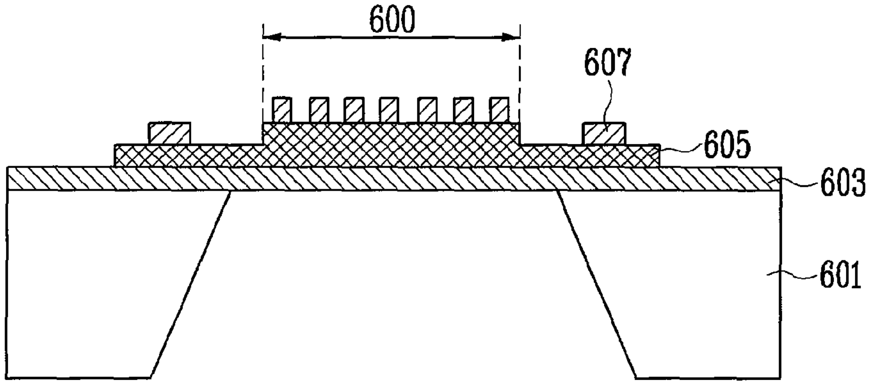
FIG. 6 is a cross-sectional view of a micro-speaker using a piezoelectric element according to an embodiment of the present invention.

FIG. 6 is a cross-sectional view of a micro-speaker using a piezoelectric element according to an embodiment of the present invention.

Referring to FIG. 6, the micro-speaker includes a silicon substrate layer 601, an insulating layer 603, a piezoelectric layer 605, and an electrode layer 607.

The silicon substrate layer 601 is a silicon substrate used as a base when manufacturing the micro-speaker through the MEMS process. In the last process, the silicon substrate layer 601 is etched for the vibration of the piezoelectric element.

The insulating layer 603 is a thin film that generally includes a silicon compound. When the silicon substrate layer 601 is etched, the insulating layer 603 serves as the thin film for masking it.

The piezoelectric layer 605 is one of the most important parts in the piezoelectric micro-speaker and includes the piezoelectric element for converting an electrical signal into a physical vibration signal based on sound.

The electrode layer 607 transfers the electrical signal to the piezoelectric layer 605. Like the piezoelectric layer 605, the electrode layer 607 is one of the most important parts.

In the piezoelectric micro-speaker according to an embodiment of the present invention, contrary to the conventional micro-speaker, the piezoelectric element vibrates depending on a mating electrode 600. Further, contrary to the conventional micro-speaker using the mating electrode, the piezoelectric micro-speaker according to an embodiment of the present invention is more thinly manufactured by precisely etching an outer circumference of the piezoelectric layer 605 formed before forming the electrode layer 607 and the mating electrode 600.

In particular, the piezoelectric layer 605 is etched with respect to an outer circumferential portion where the electrode layer 607 is, except for a portion where the mating electrode 600 will be patterned, so that a part that is irrelevant to generating sound is more thinly etched.

Here, the etching employs dry etching using inductively coupled plasma or mechanical grinding. Unlike wet etching, the dry etching improves the properties of the speaker since the etched surface of the piezoelectric layer 605 becomes smooth.

Figure 7:
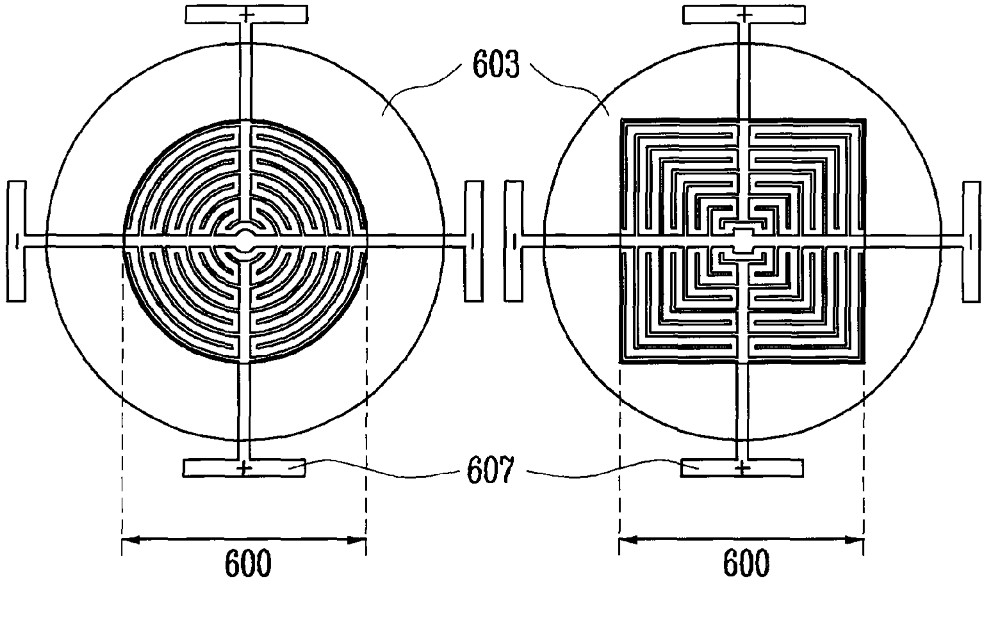
FIG. 7 is a plan view of the piezoelectric micro-speaker using the piezoelectric element according to an embodiment of the present invention.

FIG. 7 is a plan view of the piezoelectric micro-speaker using the piezoelectric element according to an embodiment of the present invention.

Referring to FIG. 7, there are a pattern portion 600 where the mating electrode is formed on the piezoelectric layer, and an outer circumferential portion 603 where the piezoelectric layer is differentially etched to be thin without the mating electrode. With this configuration, if the piezoelectric layer contacting the pattern portion 600 is strained by a piezoelectric effect, the outer circumferential portion 603 vibrates depending on the strain generated in the piezoelectric layer contacting the pattern portion 600, thereby generating sound. Accordingly, the more thinly the outer circumferential portion 603 is etched, the more easily it vibrates with even small strain. However, the conventional micro-speaker has the piezoelectric element whose outer circumferential portion has the same thickness as the pattern portion. On the other hand, the micro-speaker according to an embodiment of the present invention has the piezoelectric element whose outer circumferential portion 603 is dry-etched and worn out to be thinner than the pattern portion 600, thereby improving the properties of the micro-speaker.

Figure 8:
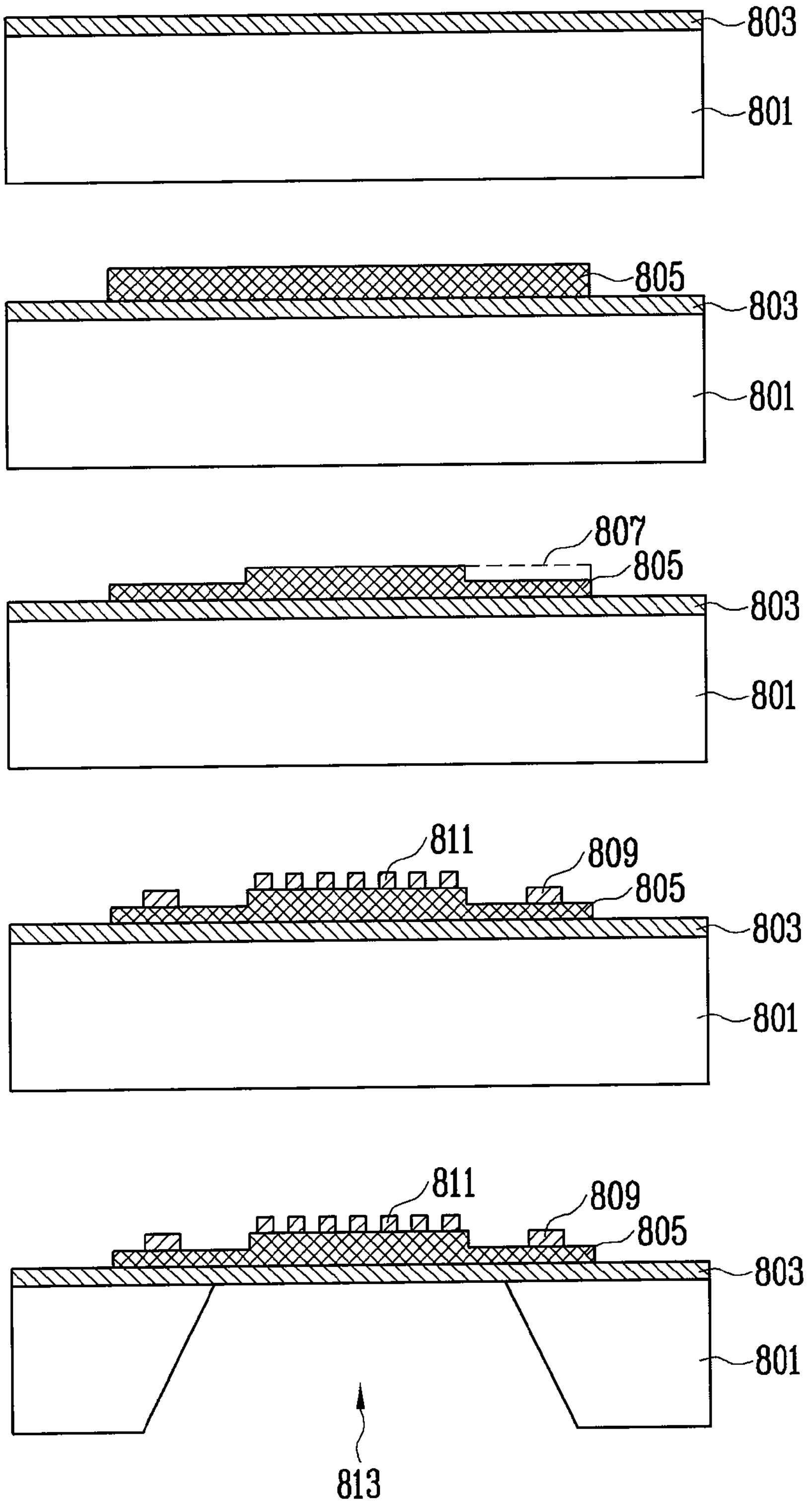
FIG. 8 illustrates a method of manufacturing the piezoelectric micro-speaker using the piezoelectric element according to an embodiment of the present invention.

FIG. 8 illustrates a method of manufacturing the piezoelectric micro-speaker using the piezoelectric element according to an embodiment of the present invention.

Referring to FIG. 8, an insulating layer 803 is formed on a silicon substrate layer 801. The insulating layer 803 includes a silicon oxide series compound such as $SiO_2$, and a silicon nitride series compound $SiN_x$. The insulating layer 803 includes a material resistant to the etching so that it is not etched when the rear silicon substrate 801 is etched.

Then, an adhesive is applied to the insulating layer 805 and a piezoelectric material 805 is adhered to the insulating layer 805. Here, the adhesive may include an epoxy series adhesive. The piezoelectric material 805 may include a single crystal piezoelectric material. Alternatively, a sol-gel method may be used instead of the adhesive.

Then, the piezoelectric material is etched. Here, the dry etching using inductively coupled plasma or the mechanical grinding may be used. Unlike conventional wet etching, the dry etching causes the piezoelectric material to be smooth.

This etching is applied to an unnecessary part 807, except a part where the mating electrode will be formed in the following process.

After forming the piezoelectric material, an electrode 809 is formed and at the same time as the mating electrode 811 to have a predetermined pattern. When the mating electrode is formed, the piezoelectric material 805 vibrates depending on the mating electrode.

In the last process, etching 813 is applied to the silicon substrate layer 801. To this end, a deep reactive ion etching (DRIE) method or potassium hydroxide (KOH) method is used after a photoresist is transferred to the silicon substrate layer 801.

With the above-described method, the micro-speaker according to an embodiment of the present invention improves acoustic properties more than the conventional micro-speaker since a vibration portion for generating sound is more flexible.

Figure 9:
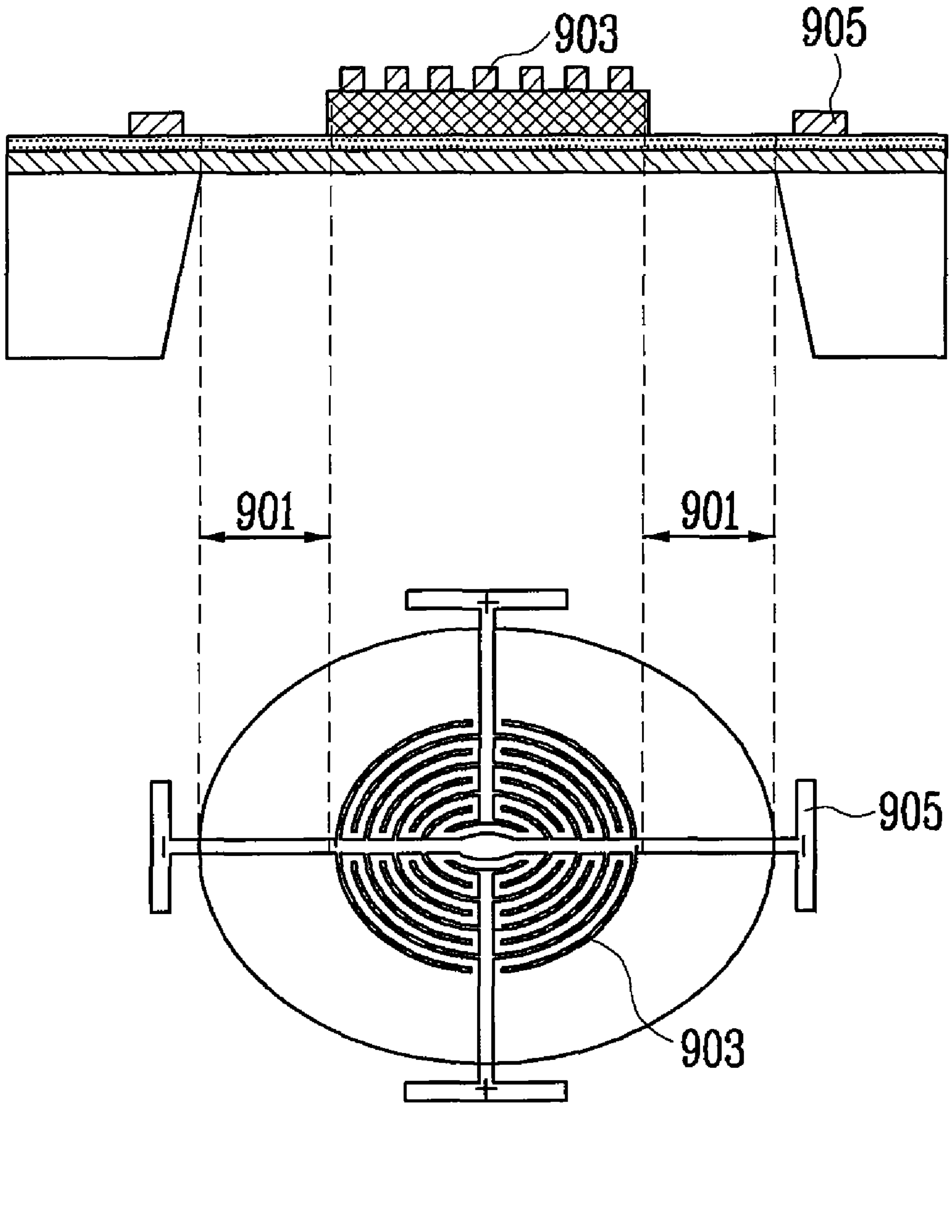
FIG. 9 shows a plan view and a side view of a piezoelectric micro-speaker using a piezoelectric element according to another embodiment of the present invention.

FIG. 9 shows a plan view and a side view of a piezoelectric micro-speaker using a piezoelectric element according to another embodiment of the present invention Referring to FIG. 9, a piezoelectric material 90l is completely etched and removed except for a part where a mating electrode 903 is patterned. In other words, there is no piezoelectric material between an electrode layer 905 and the mating electrode 903.

From the plan view, the mating electrode is patterned around the center of the micro-speaker, and the outer circumference thereof exposes the insulating layer.

Figure 10:
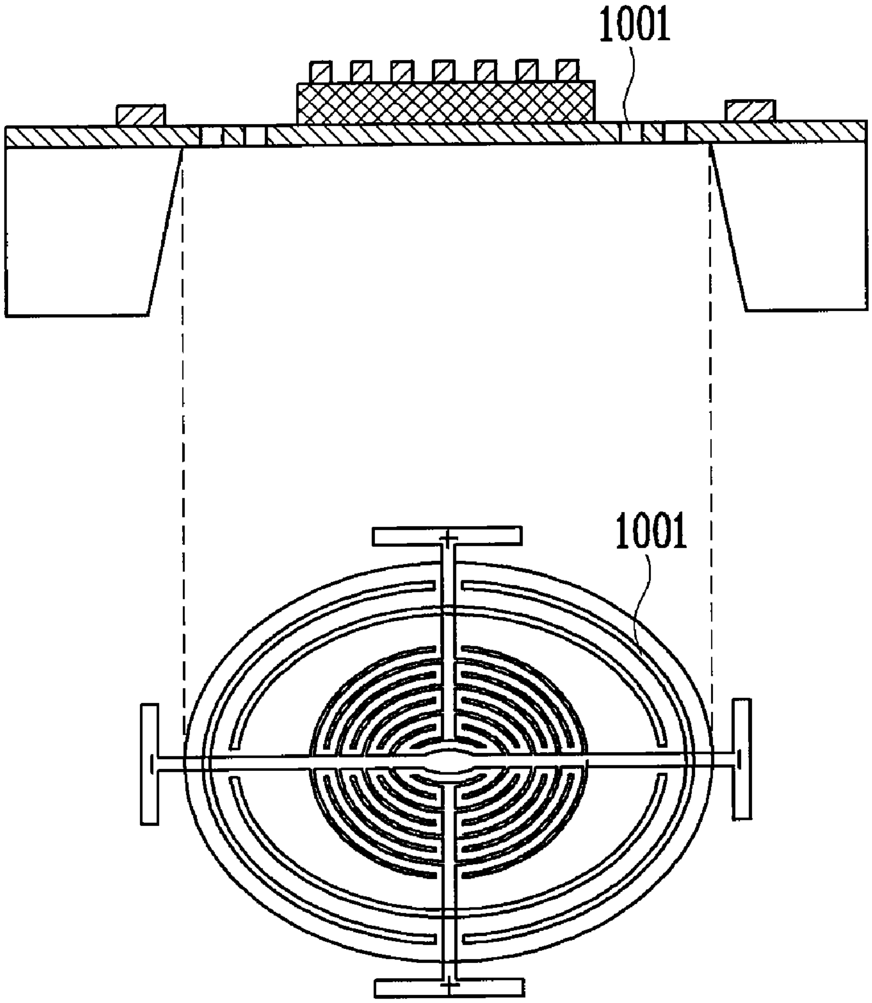
FIG. 10 shows a plan view and a side view of a piezoelectric micro-speaker using a piezoelectric element according to a third embodiment of the present invention.

FIG. 10 shows a plan view and a side view of a piezoelectric micro-speaker using a piezoelectric element according to a third embodiment of the present invention.

Referring to FIG. 10, an insulating layer is bored to have a slot 1001, and the slot 1001 is filled with a filling material, except a part where a mating electrode is patterned.

In this case, the filling material is a rubber film or a highly elastic resin film. As the thin film is filled with such a highly elastic material, vertical vibration of the piezoelectric material is less restricted and sound pressure output is much enhanced. Further, the pattern of the slot 1001 may have an effect on a resonance frequency, so that a low-pitched sound can be advantageously reinforced.

Figure 11:
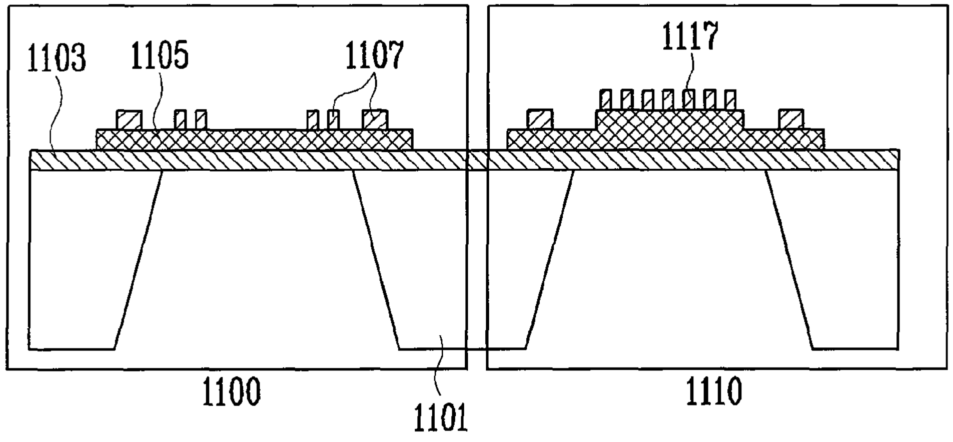
FIG. 11 illustrates a microphone-speaker integrated device in which a microphone and a micro-speaker are integrated according to an embodiment of the present invention.

FIG. 11 illustrates a microphone-speaker integrated device in which a microphone and a micro-speaker are integrated according to an embodiment of the present invention.

Referring to FIG. 11, an insulating layer 1103 is deposited on a silicon substrate 1101, and a piezoelectric layer 1105 is formed on the insulating layer 1103. Then, electrodes 1107 and 1117 are patterned, thereby completing the microphone-speaker integrated device.

In this microphone-speaker integrated device, the microphone within the block corresponding to reference numeral '1100' and the micro-speaker within the block corresponding to reference numeral '1110' may be manufactured through the same processes.

For example, the same insulating layer 1103 and the same piezoelectric layer 1105 are formed on the same silicon substrate 1101. Then, in the process of etching the micro-speaker, the piezoelectric layer 1105 connecting a micro-speaker portion 1110 and a microphone portion 1100 is etched and separated, and the upper piezoelectric layer for the micro-speaker is etched according to an embodiment of the present invention. Then, the mating electrodes 1107, 1117 are formed to have the pattern according to an embodiment of the present invention. Thus, the microphone-speaker integrated device is simply manufactured.

This microphone-speaker integrated device is used for a directional speaker or a microphone since its manufacturing process is relatively simple, the microphone and speaker can be formed as a single body, and the size is small.

Figure 12:
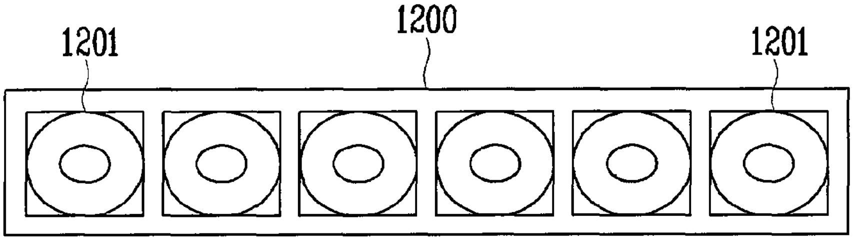
FIG. 12 illustrates a speaker array according to an embodiment of the present invention.

FIG. 12 illustrates a speaker array according to an embodiment of the present invention.

Referring to FIG. 12, a piezoelectric speaker according to an embodiment of the present invention may be manufactured by aligning a plurality of mini piezoelectric speakers 1201 as shown by reference numeral '1200.' Such a speaker array 1200 is used in manufacturing a directional speaker that uses acoustic interference to transfer sound to a certain position. Particularly, in the case of a mobile phone or similar private acoustic environment, the size of the speaker array 1200 has to be as small as possible so that it can be portable. Accordingly, the size and performance of each speaker 1201 constituting the speaker array 1200 is important. In this case, the speaker according to an embodiment of the present invention has satisfactory size and performance.

As described above, the present invention provides a piezoelectric microphone, a speaker, a microphone-speaker integrated device, and a manufacturing method thereof.

Further, the present invention provides a piezoelectric microphone, a speaker, a microphone-speaker integrated device, and a manufacturing method thereof, in which the microphone has a mating electrode pattern arrayed in series, and the speaker has a differentially etched piezoelectric plate and a series/parallel mating electrode pattern.

Although exemplary embodiments of the present invention have been disclosed for illustrative purposes, those skilled in the art will appreciate that various modifications, additions, and substitutions are possible, without departing from the scope of the present invention. Therefore, the present invention is not limited to the above-described embodiments, but is defined by the following claims, along with their full scope of equivalents.

What is claimed is:

1. A method of manufacturing a piezoelectric microphone, comprising:

depositing an insulating layer over a silicon substrate;
forming a piezoelectric plate over the insulating layer; and
forming a mating electrode over the piezoelectric plate,
wherein the mating electrode includes a cathode mat pattern and an anode mat pattern, and
wherein the cathode mat pattern and the anode mat pattern are coupled to each other in series.

2. A method of manufacturing a piezoelectric speaker, comprising:

depositing an insulating layer over a silicon substrate;
forming a piezoelectric plate over the insulating layer, the piezoelectric plate including a piezoelectric strain region and a vibration region; and
forming a mating electrode in the piezoelectric strain region of the piezoelectric plate,
wherein the piezoelectric plate is thinner in the vibration region than in the piezoelectric strain region.

3. The method according to claim 2, wherein the vibration region is formed at an outer portion of the piezoelectric strain region.

4. A piezoelectric microphone comprising:

a silicon substrate;
an insulating layer provided over the silicon substrate;
a piezoelectric plate provided over the insulating layer; and
a mating electrode provided over the piezoelectric plate,
wherein the mating electrode includes a cathode mat pattern and an anode mat pattern, and
wherein the cathode mat pattern and the anode mat pattern are coupled to each other in series.

5. The piezoelectric microphone according to claim 4, wherein the silicon substrate is etched from a rear surface to the insulating layer so that the piezoelectric plate is suspended.

6. The piezoelectric microphone according to claim 4, wherein the insulating layer comprises any of a silicon oxide layer and a silicon nitride layer.

7. The piezoelectric microphone according to claim 4, wherein the piezoelectric plate is either coupled to the insulating layer using an epoxy based adhesive or deposited over the insulating layer using a sol-gel method.

8. The piezoelectric microphone according to claim 4, wherein the piezoelectric plate comprises PZT, PMN-PT, PVDF, ZnO, AIN or a lead-free piezoelectric material.

9. The piezoelectric microphone according to claim 4, wherein the mating electrode is more dense at an outer portion or a center portion of the piezoelectric plate than therebetween.

10. A piezoelectric speaker comprising:

a silicon substrate;

an insulating layer provided over the silicon substrate;

a piezoelectric plate provided over the insulating layer, the piezoelectric plate including a piezoelectric strain region and a vibration region; and a mating electrode provided in the piezoelectric strain region of the piezoelectric plate, wherein the piezoelectric plate is thinner in the vibration region than in the piezoelectric strain region.

11. The piezoelectric speaker according to claim 10, wherein the vibration region is formed at an outer portion of the piezoelectric strain region.

12. The piezoelectric speaker according to claim 10, wherein the silicon substrate is etched from a rear surface to the insulating layer so that the piezoelectric strain region and the vibration region are suspended.

13. The piezoelectric speaker according to claim 10, wherein the insulating layer comprises any of a silicon oxide layer and a silicon nitride layer.

14. The piezoelectric speaker according to claim 10, wherein the piezoelectric plate is either coupled to the insulating layer using an epoxy based adhesive or deposited over the insulating layer using a sol-gel method.

15. The piezoelectric speaker according to claim 10, wherein the piezoelectric plate comprises PZT, PMN-PT, PVDF, ZnO, AIN or a lead-free piezoelectric material.

16. The piezoelectric speaker according to claim 10, wherein the piezoelectric plate is etched using either a mechanical grinding method or a dry etch using inductively coupled plasma.

17. The piezoelectric speaker according to claim 10, wherein the insulating layer is etched and the etched pattern is filled with one of a rubber film and a highly elastic resin film.

18. A piezoelectric speaker-microphone integrated device including the piezoelectric microphone of claim 1 and the piezoelectric speaker of claim 10 are provided over the same silicon substrate.

* * * * *